United States Patent [19]

Yamazaki et al.

[11] Patent Number: 5,039,620
[45] Date of Patent: * Aug. 13, 1991

[54] METHOD OF MAKING A PHOTOELECTRIC CONVERSION DEVICE WITH A HIGH RESPONSE SPEED

[76] Inventors: Shunpei Yamazaki, 21-21, Kitakarasuyama 7-Chome, Setagaya-Ku, Tokyo 157; Toshimitsu Konuma, Flat Atsugi 206, 931-1, Hase, Atsugi-Shi, Kanagawa-Ken 243; Toshiji Hamatani, Flat Ochiai 201, 1144, Hase, Atsugi-Shi, Kanagawa-Ken 243; Akira Mase, Terrace Hase 3-3, 381-1, Hase, Atsugi-Shi, Kanagawa-Ken 243; Toshiharu Yamaguchi, Flat Meiwa 201, 2-4993-2, Sobudai, Zama-Shi, Kanagawa-Ken, 228; Mitsunori Sakama, 1173, Kamiyoshizawa, Hiratsuka-Shi, Kanagawa-Ken, 259-12; Takashi Inujima, Terrace Hase 2-3, 381-1, Hase, Atsugi-Shi, Kanagawa-Ken, 243, all of Japan

[ * ] Notice: The portion of the term of this patent subsequent to Feb. 21, 2006 has been disclaimed.

[21] Appl. No.: 124,566

[22] Filed: Nov. 24, 1987

Related U.S. Application Data

[62] Division of Ser. No. 851, Jan. 6, 1987.

[30] Foreign Application Priority Data

Jan. 6, 1986 [JP]  Japan ................................. 61-1008
Jan. 6, 1986 [JP]  Japan ................................. 61-1009
Mar. 31, 1986 [JP]  Japan ................................ 61-73746

[51] Int. Cl.⁵ ..................... H01L 31/04; H01L 31/38
[52] U.S. Cl. .................................... 437/3; 437/2; 437/4; 437/170; 437/172; 437/228
[58] Field of Search .................. 437/2, 3, 4, 5, 83, 437/170, 172, 228; 357/29, 30

[56] References Cited

U.S. PATENT DOCUMENTS

| | | | |
|---|---|---|---|
| 3,941,672 | 3/1976 | Tamaka et al. | 437/3 |
| 3,955,082 | 5/1976 | Dyment | 437/3 |
| 4,398,343 | 8/1983 | Yamazaki | 437/172 |
| 4,527,007 | 7/1985 | Fuse | 437/4 |
| 4,660,277 | 4/1987 | Tei | 437/3 |
| 4,678,542 | 7/1987 | Boer et al. | 357/4 |
| 4,690,717 | 9/1987 | Yamazaki | 437/2 |
| 4,711,857 | 12/1987 | Cheng | 437/3 |
| 4,728,997 | 3/1988 | Szydlo et al. | 437/3 |
| 4,806,496 | 2/1989 | Suzuki et al. | 437/2 |

Primary Examiner—Brian E. Hearn
Assistant Examiner—Tom Thomas

[57] ABSTRACT

An improved photoelectric conversion device is shown. The device includes a plurality of photoelectric semiconductor elements each of which are composed of a first electrode and a semiconductor layer and a second electrode. The opposed surfaces of semiconductor layer is completely covered by the first and second electrodes.

2 Claims, 14 Drawing Sheets

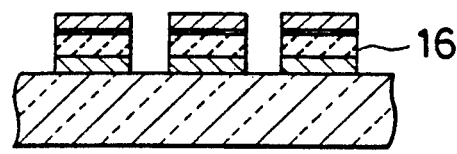
FIG. 2(E)
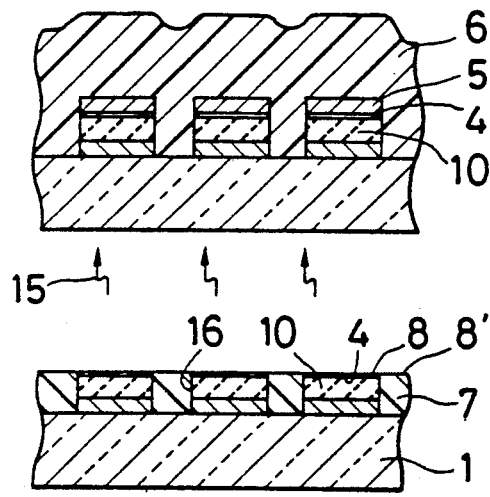
FIG. 2(F)
FIG. 2(G)

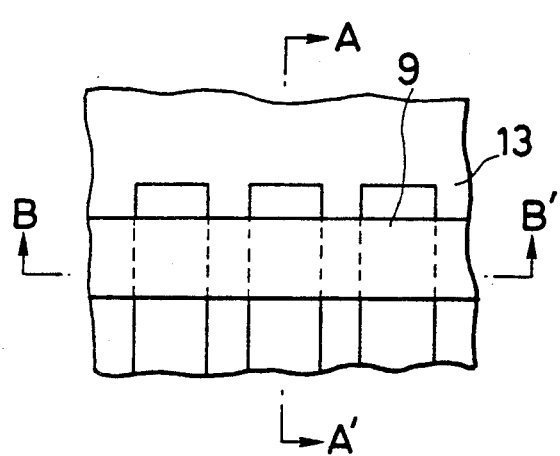
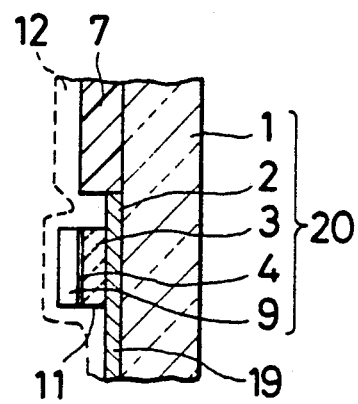
FIG.4(D)  FIG.4(E)
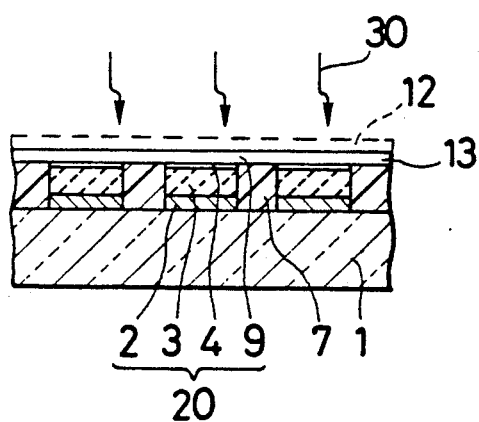
FIG.4(F)

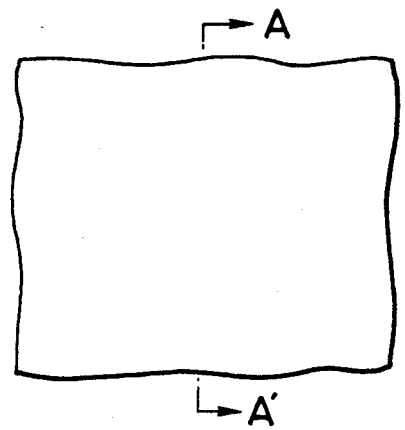
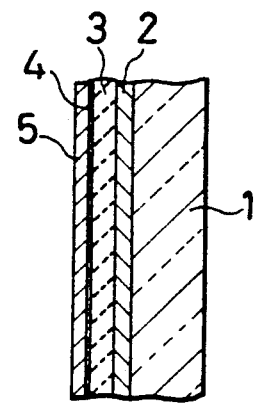
FIG.6(A)   FIG.6(B)
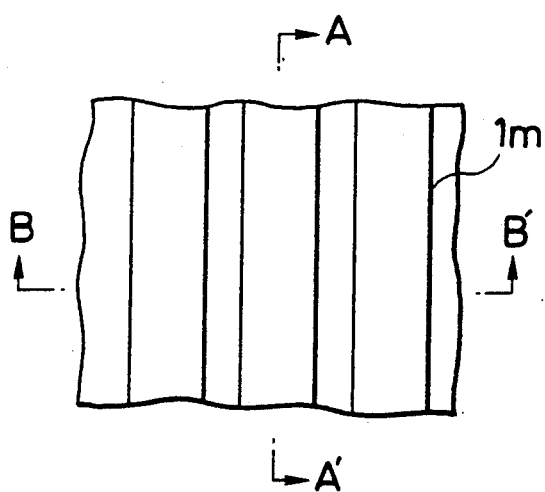
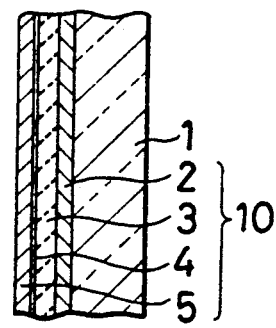
FIG.6(C)   FIG.6(D)

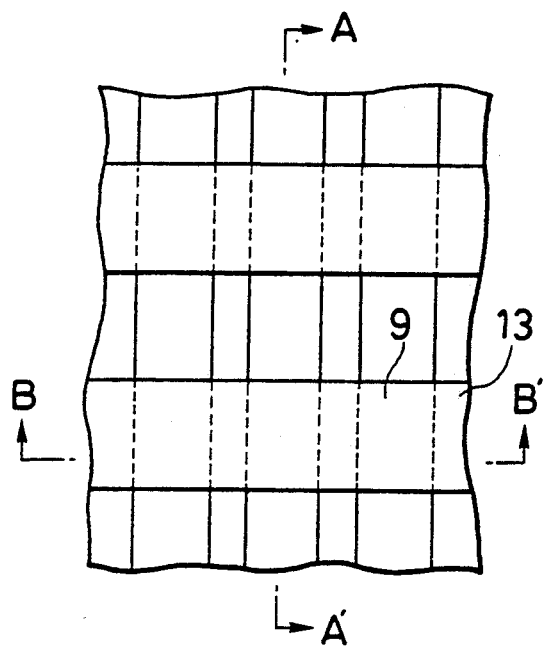
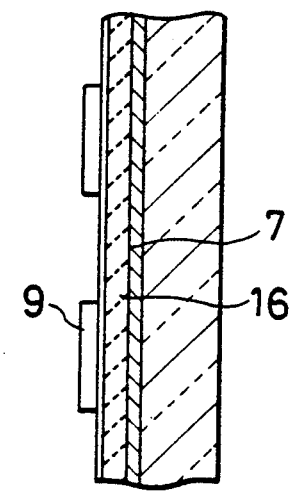
FIG.6(H)   FIG.6(I)
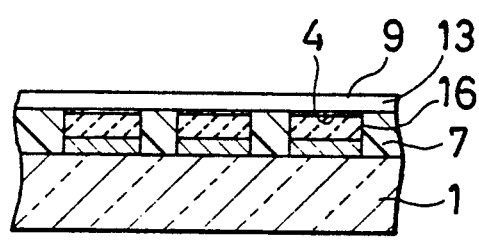
FIG.6(J)

METHOD OF MAKING A PHOTOELECTRIC CONVERSION DEVICE WITH A HIGH RESPONSE SPEED

This is a division of Ser. No. 000,851, filed Jan. 6, 1987.

BACKGROUND OF THE INVENTION

The present invention relates to a photoelectric conversion device.

Heretofore a variety of applications of photoelectric conversion devices have been proposed. As a example of such a application, a contact image sensor for facsimile machine is schematically illustrated in FIG. 1. The sensor is comprised of a photosensitive semiconductor layer 3 provided with a pair of electrodes 2 and 4 on the opposed surfaces, which are fabricated by a lithography using three masks.

The fabrication method of this prior device is as follows. First, a conductive layer of chromium is formed on a substrate 1 and patterned with a first mask 1m to form a plurality of first electrodes 2. Over the patterned electrode 2, a photosensitive intrinsic semiconductor layer of amorphous silicon is deposited to a thickness of 1 micrometer by a glow discharge method and patterned with a second mask 2m of a metal to form a photoelectric conversion layer 3. As the semiconductor layer 3, the amorphous silicon layer is formed in such a way that the patterned layer covers the first electrode 2 sufficiently even with a possible displacement of the mask 2m. Then, a conductive layer of tin indium oxide is formed on the semiconductor layer 3 and patterned with a third mask 3m to form a second electrode 4. A rectifying diode can be formed from a junction (MI junction) between the second electrode 4 and the semiconductor layer 3, a Schottky barrier.

When light is incident on the semiconductor layer 3 through the second electrode 4 as shown in FIG. 1(C), electron-hole pairs are generated in proportion to the intensity of the incident light.

The image sensor shown in FIGS. 1(A) to 1(C), however, is constructed with the semiconductor layer 3 larger than the first electrodes 2. Because of this, there are generated electron-hole pairs also in the region that is disposed vertically between the opposed electrodes 2 and 4 and lateral drifts of the carriers generated in the region take place as shown in FIG. 1(A) with arrows. The lateral drift imparts a lag to the response.

On the other hand, the intrinsic semiconductor layer fabricated as in the above tends to form a parasitic channel on an exposed surface thereof which is easily transformed into an n-type, causing a large dark current and dispersion in the quality of products. Further, the use of three masks reduces the cost performance.

SUMMARY OF THE INVENTION

It is therefore an object of the invention to provide improved photoelectric conversion devices and methods for manufacturing the same.

It is another object of the invention to provide improved photoelectric conversion devices and methods for manufacturing the same capable of conversing incident light at the real time.

It is further object of the invention to provide improved photoelectric conversion devices and methods for manufacturing the same in which little time lag occur in response to incident light.

It is still further object of the invention to provide improved photoelectric conversion devices and methods for manufacturing the same with few parasitic channels.

BRIEF DESCRIPTION OF THE DRAWINGS

FIGS. 2(A) through 2(M) are plan views and section views showing a linear contact image sensor in accordance with the present invention;

FIGS. 4(A) through 4(F) are plan views and section views showing a further linear contact image sensor in accordance with the present invention;

FIGS. 6(A) through 6(M) are plan views and section views showing a two-dimensional contact image sensor in accordance with the present invention.

DETAILED DESCRIPTION OF THE PREFERRED EMBODIMENT

Figure 1A:
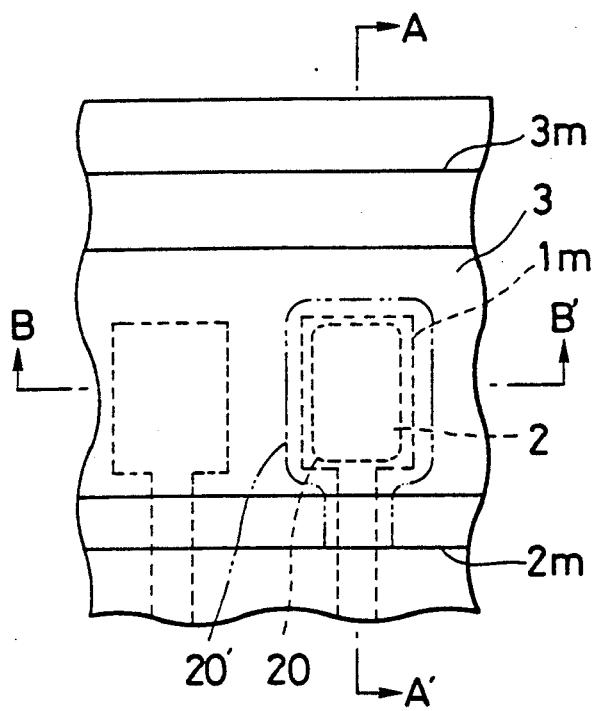
FIGS. 1(A), (B) and (C) show a prior art image sensor.
Figure 1B:
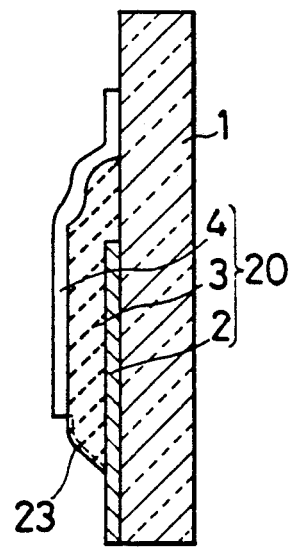
Figure 1C:
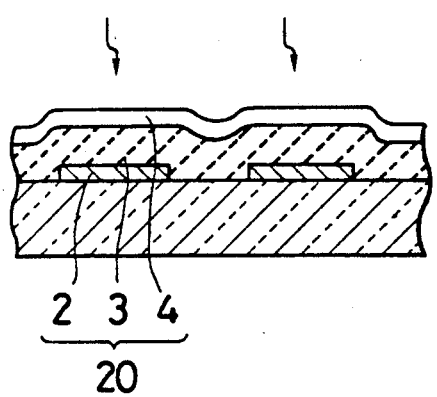

Referring to FIGS. 2(A) to 2(M), an embodiment of the invention is illustrated according to the manufacturing process thereof.

On a heat resi ing transparent substrate such as a quartz plate or a pyrex glass plate, a first conductive layer 2, a photosensitive semiconductor layer 3, and a second conductive layer 5 are formed in sequence. The first conductive layer is a tin indium oxide layer with 2000 Å in thickness. The semiconductor layer is composed of at least a substantially intrinsic semiconductor layer, such as an amorphous silicon semiconductor layer incorporating a p-i-n, n-i-n or m-i junction therein, and deposited by a known CVD system. The silicon semiconductor layer apparently has a slight n- type conductivity, so that it may be doped with such a p-type impurity as boron to make the semiconductor substantially intrinsic.

For instance, the semiconductor layer is composed of a 200 Å thick p-type semiconductor layer, a 3500 Å thick intrinsic semiconductor layer and a 300 Å thick n-type semiconductor layer, which are deposited by a multi-chamber plasma enhanced CVD system (as disclosed in Japanese Patent application No.sho 54-104452 by the applicant). In this case, the second conductive layer 5 is formed of chromium with 1000 Å in thickness and a transparent conductive layer 4 of chromium silicide is formed as a by-product with 10 to 200 Å in thickness between the semiconductor layer 3 and the chromium layer 5. The chromium silicide layer 4 makes the contact between the semiconductor layer 3 and the electrode 5 ohmic as a buffer layer.

A reverse bias voltage across the laminate layers is applied to cure the defects in the semiconductor layer 3. Namely, the first conductive layer 2 is connected with the positive electrode of a voltage supply and the second conductive layer 4 is connected wi the negative elctorode o he voltage supply and the applied voltage is gradually increased. In this process, the current passing the semiconductor layer is increased with overlapped irregular transient currents as the applied voltage increases. However, the passing current is suddenly decreased when the applied voltage reaches 3 to 5 V and is stabilized at the level in correspondance with the specific resistance of the semiconductor when the reverse bias voltage increases to 10 V. The phenomenon can be explained as: defects have resistivities substantially smaller than a normal portion of the semiconductor layer and the current flow passing therethrough accounts for the transient currents, and more clealy speaking, the defects are recognized adverse therefore. The currents across the defects are spacially limited and made intensive, so that the heat produced by the current burns the defects and makes insulating the same. The applied voltage, of course, must be lower than the breakdown voltage of the semiconductor layer 3.

Figures 2A, 2B:
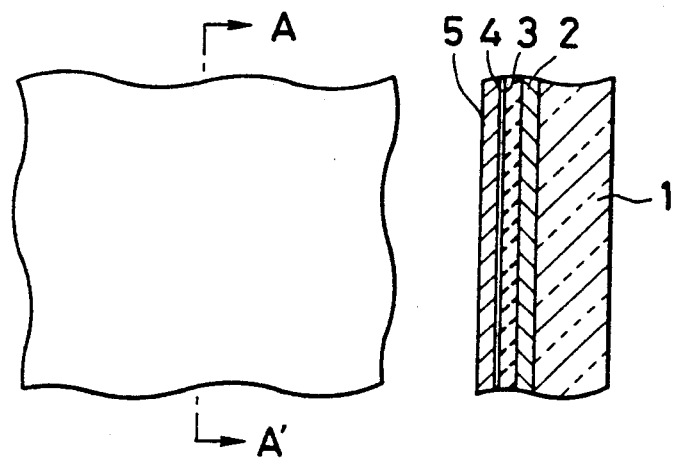
Figures 2C, 2D:
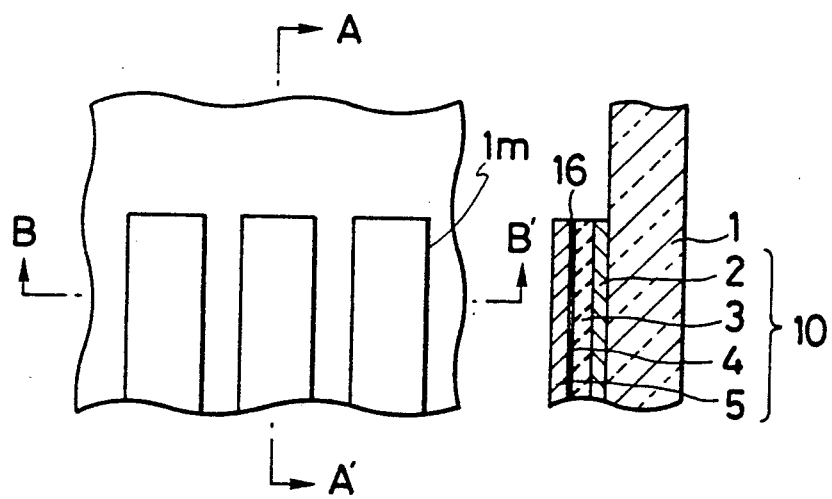

Next, the laminate layers of the conductive layers 2, 4 and 5 and the semiconductor layer 3 are integrally etched by means of a first mask 1m to produce a plurality of extending laminate members 10 as shown in FIGS. 2(C), (D) and (E).

The laminate members 10 are thus to be formed in a linear array of which each element is 100 micrometers wide and 150 micrometers long with an interval of 30 micrometers.

As shown in FIG. 2(F), a photocurable organic resin layer 6, e.g., an aromatic polyimide precursor solution is formed with 1.6 micrometers in thickness by a coating method so as to completely encloses the cell mbers 10. Then, the trans en. substrate 1 is pre-baked in a clean oven at 80° C. for an hour and irradiated from the back surface thereof with ultraviolet light by a known mask aligner but using no mask. The irradiation time is about two minutes when an aligner distributed from Cobilt Co is used. After curing, the uncured portion of the resin layer is removed using a suitable rinsing liquid so that the remaining resin layer and the transparent conductive layer 4 are in the same height. In this connection, the curing treatment reduces the volume of the resin approximately by a factor of 2, so that the thickness of the resin layer before curing is chosen about 1.6 micrometers for the members with 0.8 micrometer in thickness. With ultraviolet light having 300 to 400 nm wavelength (10mW/cm$^2$), the irradiation time is sufficiently 15 to 30 seconds.

After the etching, the substrate 1 is heated in a nitrogen atmosphere at 180° C. for 30 minutes, at 300° C. for 30 minutes and at 400° C. for 30 minutes. Next, the chromium layer 5 is removed by a known etching solution and the transparent chromium silicide layer 4 remains alone on the semiconductor 3 (see FIG. 2(G). The chromium silicide layer 4 prevents an indium tin oxide (ITO) layer, when formed on the semiconductor layer 3 in the subsequent step, from degradation caused by interaction between the semiconductor layer and the ITO layer.

Figures 2H, 2I:
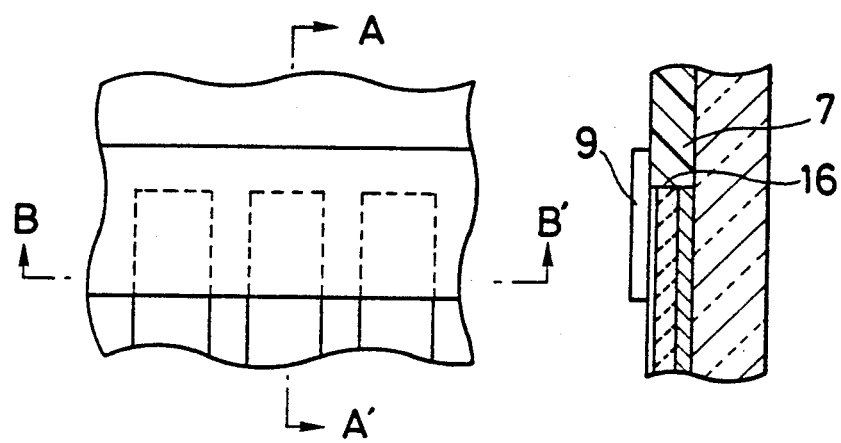
Figure 2J:
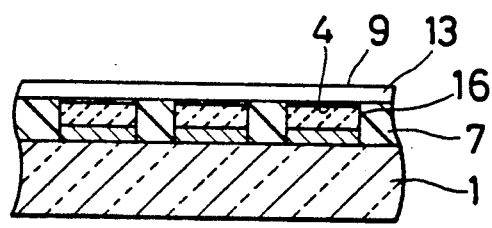
Figures 2K, 2L:
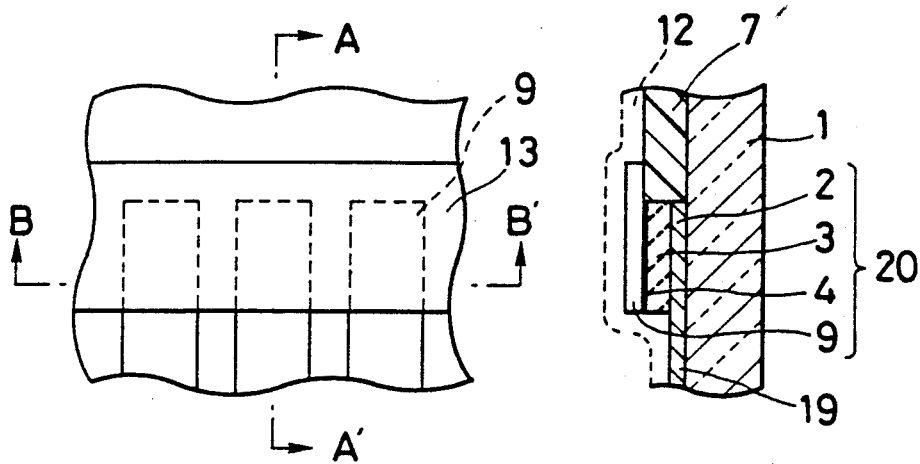
Figure 2M:
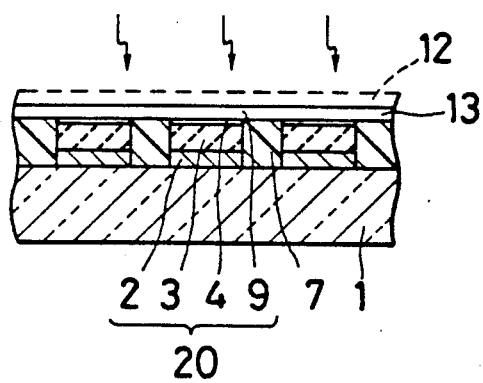

Then, as shown in FIGS. 2(H), 2(I) and 2(J), a tranparent electrode made of tin oxide is formed with 0.1 to 0.5 micrometer in thickness over the extending ends of the laminate members 10, and selectively etched with a second photomask 2m. With the transparent electrode 9 as a mask, the semiconductor layer 3 are etched together with the chromium silici layer 4, remaining the part of the same that is only behind the electrode 9 Finally, the upper surface of the device is coated with a resin layer 12 as shown in FIGS. 2(L) and (M). Then, the manufacturing of an image sensor with a smooth top surface is completed. For example, the elements can be aligned 8 cell per 1 mm in a line.

The inventor has been examined the vicinity of the contact between the elements and the resin layer by an electron microscope in advance of forming the electrode 9. As a result, there have been observed slight unevenness but no crack which tends to be a cause of a short current between the opposed electrodes 2 and 4 by drawing the material of the electrode 2 or 4 and also observed is no projection which might leads a disconnection of patterns arranged thereon, and the two laterally adjacent layers are recognized as smoothly connected with each other. By virtue of this configuration, it becomes possible to superimposed ITO (indium tin oxide) layer as the electrode 9 on the layers without causing any possibility of disconnection at the position just above the interface.

The photoelectric conversion element 20 thus formed is comprised of the first electrode 2 in contact with the line 19, the semiconductor layer 3, the second electrode 4 and the third electrode 5 in contact with the line 13. And the semiconductor layer 3 is completely enclosed with the electrodes at the top and bottom surfaces and the resin layers at the side surfaces so that no current leakage and no parasitic channel takes place on the semiconductor layer.

Further, the osed electrodes 2 and 4 have opposed to each other through the semiconductor layer 3 which has the same area and the same shape as the electorodes 4 and 5 regardless of the precision of the patterning.

An example of the photoelectric characteristics obtained by a experiment using a photoelectric device with p-i-n junctions according to the invention will be described hereinbelow. Namely, the dark current with an applied voltage of 3 V is $1.8 \times 10^{-13}$ A (the cell area; 100 microns × 150 microns) and the photo current with an irradiation of 100 Lx is $3.5 \times 10^{-8}$ A. The response characteristics of the device was such that incident light switching over per one microsecond could be followed up. A prior art device as described above could not follow up such a frequent change.

Another experiment was made for a photoelectric device incorporating n-i-n junctions therein. Characteristics of the current passing through the junction versus the applied bias is symmetrical about the zero bias. The dark current was $4 \times 10^{-13}$ A and the photo conductivity with reference light of 100 Lx. The device could follow satisfactorily up an intermittent irradiation at intervals of 0.2 microsecond.

Figures 3A, 3B:
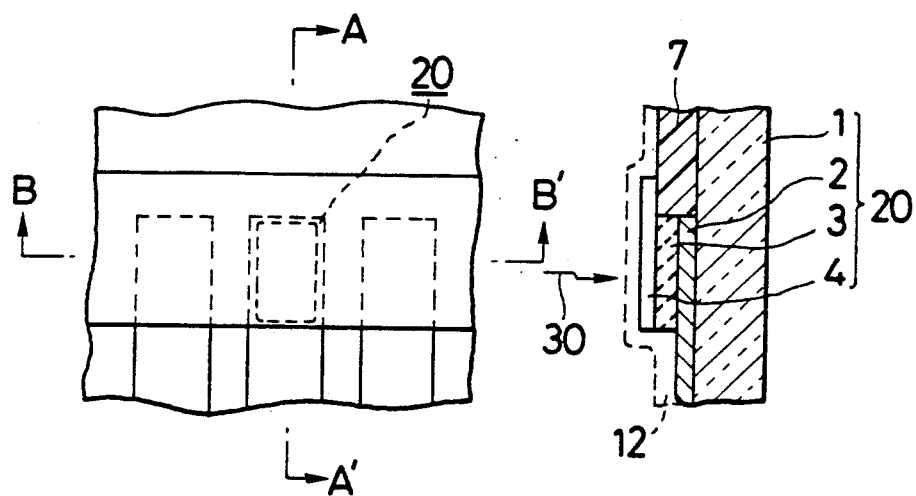
FIGS. 3(A) through 3(C) are a plan view and section views showing another linear contact image sensor in accordance with the present invention.
Figure 3C:
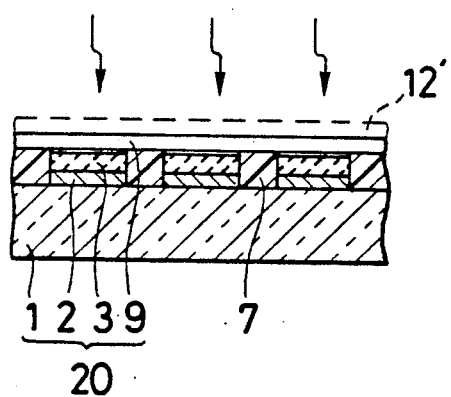

FIGS. 3(A) through 3(C) show another linear contact image sensor in accordance with the present invention. In this embodiment the formation of the chromium silicide layer 4 is despensed with and other processing and configuration are same as the foregoing embodiment so that redundant description is not repeated. Namely, the chromium layer 5 is not formed.

The above embodiments pertain to linear contact image sensors in which the outer electrodes thereof are designed larger than the corresponding semiconductor regions. By virtue of this configuration, no side drifts of carriers and no response lag take place.

FIGS. 4(A) through 4(F) are illustrated to show a further linear image sensor according to the invention in which the upper electrode is formed coincident with the semiconductor layer in one direction. The process for this embodiment is same as that of the former embodiment until the steps shown in FIGS. 2(A) through 2(G), therefore the same description is not repeated.

Figures 4A, 4B:
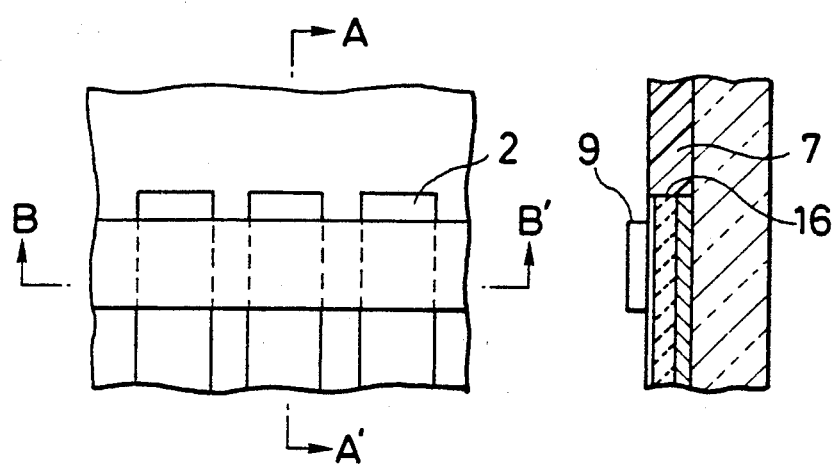
Figure 4C:
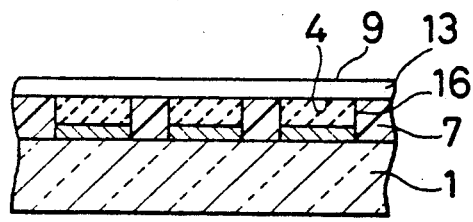

Referring to FIGS. 4(A) through 4(F), a tranparent electrode made of tin oxide is formed with 0.1 to 0.5 micrometer in thickness and selectively etched with a second photomask 2m in such a way that the ends of the members extend beyond the third electrode 9. With the transparent electrode 9 as a mask, the semiconductor layer 3 are etched together with the chromium silicide layer 4, remaining the portions of the semiconductor layer just behind the electrode 9. Thus, photosensitive elements 20 are formed with the outer electrodes 9 which are coincident with the remaining semiconductor layers in the lateral direction. Finally, the upper surface of the device is coated with a resin layer 12 as shown in FIGS. 4(E) and 4(F). Then, the manufacturing of an image sensor having an array of photoconductive elements is completed. For example, the elements can be aligned eight cells per 1 mm in a line.

FIGS. 5(A) through 5(G) show a still further linear contact image sensor according to the invention. The sensor has its substrate 1 providing the light receiving surf. The processing of the embodiment is same as the former embodiment until the step in FIG. 2(F), so that redundant description will not repeated.

Figure 5A:
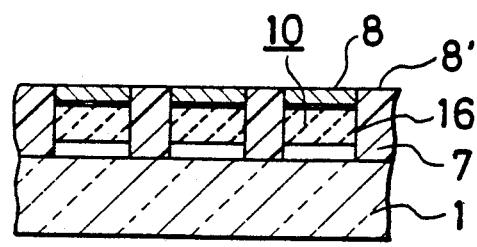
FIGS. 5(A) through 5(G) are plan views and section views showing a still further contact image sensor in accordance with the present invention.
Figures 5B, 5C:
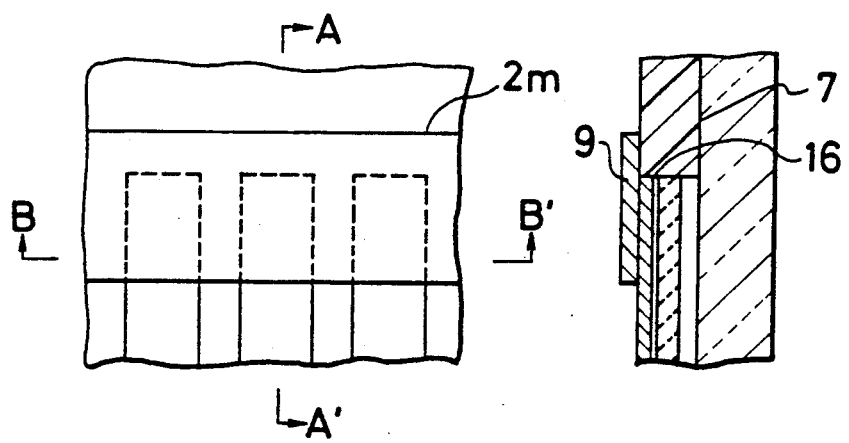
Figure 5D:
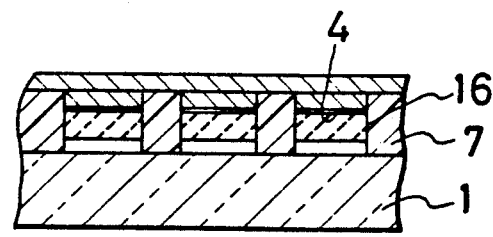
Figures 5E, 5F:
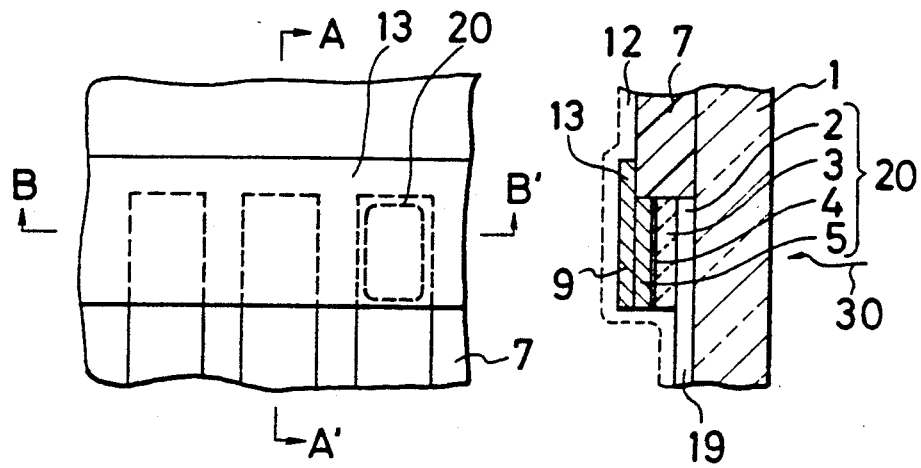
Figure 5G:
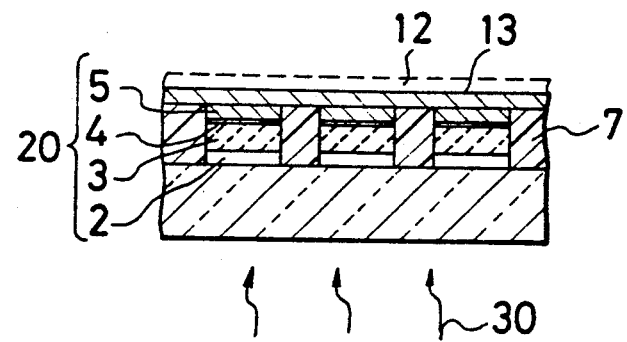

After depositing the resin layer 6 as shown in FIG. 2(E), the substrate 1 is irradiated with light from the bottom surface in such a degree as not to cure the upper portion of the resin layer which is located upper than the upper surface of the cromium layer as shown in FIG. 5(A). Then, the substrate 1 is heated in a nitrogen atmosphere at 180° C. for 30 minutes, at 300° C. for 30 minutes and at 400° C. for 30 minutes. Then, as shown in FIGS. 5(B), 5(C) and 5(D), a electrode strip is formed with 0.1 to 0.5 micrometer in thickness over the extending ends of the laminate members 10, and selectively etched with a second photomask 2m. With the transparent electrode 9 as a mask, the semiconductor layer 3 are etched together with the electrode 5 and the chromium silicide layer 4, remaining the part of the same that is behind the electrode 9. Finally, the upper surface of the device is coated with a resin layer 12 as shown in FIGS. 5(F) and (G). Then, the manufacturing of an image sensor with a smooth top surface is completed. For example, the photosensitive elements can be aligned eight cells per 1 mm in a line.

Referring to FIGS. 6(A) through 6(M), a two-dimensional image sensor of the invention is illustrated according to the manufacturing process.

On a heat resisting transparent substrate 1 such as a quartz plate or a pyrex glass plate, a first conductive layer 2, a photosensitive semiconductor layer 3, and a second conductive layer 5 are formed in sequence. The first conductive layer is a tin indium oxide layer with 2000 Å in thickness. The semiconductor layer is composed of at least a substantially intrinsic semiconductor layer, such as an amorphous silicon semiconductor layer incorporating a p-i-n, n-i-n or m-i junction therein, and deposited by a known CVD system. The silicon semiconductor layer apparently has a slight n- type conductivity, so that it may be doped with such a p-type impurity as boron to make the semiconductor substantially intrinsic.

For instance, the semiconductor layer is composed of a 200 Å thick p-type semiconductor layer, a 3500 Å thick intrinsic semiconductor layer and a 300 Å thick n-type semiconductor layer, which are deposited by a multi-chamber plasma enhanced CVD system (as disclosed in Japanese Patent application No. sho 54-104452 by the applicant). In this case, the second conductive layer 5 is formed of chromium with 1000 Å in thickness and a transparent conductive layer 4 of chromium silicide is formed as a by-product with 10 to 200 Å in thickness between the semiconductor layer 3 and the chromium layer 5. The chromium silicide layer 4 makes the contact between the semiconductor layer 3 and the electrode 5 ohmic as a buffer layer.

A reverse bias voltage across the laminate layers is applied to cure the defects in the semiconductor layer 3. Namely, the first conductive layer 2 is connected with the positive electrode of a voltage supply and the second conductive layer 4 is connected with the negative electorode of the voltage supply and the applied voltage is gradually increased. In this process, the current passing the semiconductor layer is increased with overlapped irregular transient currents as t applied voltage increases. However, the passing current is suddenly decreased when the applied voltage reaches 3 to 5 V and is stabilized at the level in correspondance with the specific resistance of the semiconductor when the reverse bias voltage increases to 10 V. The phenomenon can be explained as: defects have resistivities substantially smaller than a normal portion of the semiconductor layer and the current flow passing therethrough accounts for the current, and the defects are recognized adverse therefore. The currents across the defects are spacially limited and made intensive, so that the heat produced by the current burns the defects and makes same insulating. The applied voltage, of course, must be lower than the breakdown voltage of the semiconductor layer 3.

Figure 6E:
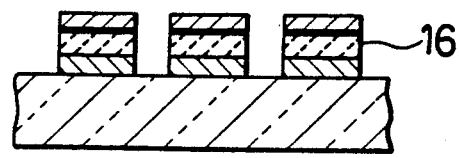

Next, the laminate layers of the conductive layers 2, 4 and 5 and the semiconductor layer 3 are integrally etched by means of a first mask 1m to produce a plurality of extending laminate members 10 as shown in FIGS. 6(C), 6(D) and 6(E).

The laminate members 10 are thus to be formed in a striped arrangement to constitute the sensitive portions of the contact image sensor and be designed in the form of a matrix composed of elements 100 micro-meters wide and 150 micrometers long with an interval of 30 micrometers.

Figure 6F:
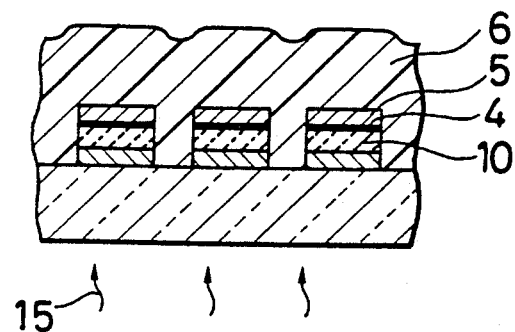
Figure 6G:
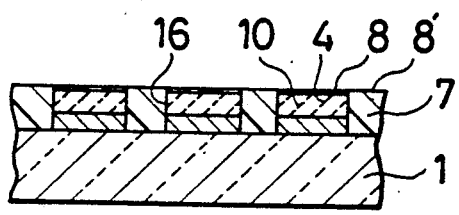

As shown in FIG. 6(F), a photocurable organic resin layer 6, e.g., an aromatic polyimide precursor solution is formed with 1.6 micrometers in thickness by a coating method so as to completely enclose the cell members 10. Then, the transparent substrate 1 is pre-baked in a clean oven at 80° C. for an hour and irradiated from the back surface thereof with ultraviolet light by a known mask aligner but using no mask. The irradiation time is about two minutes when an aligner distributed from Cobilt Co is used. After curing, the uncured portion of the resin layer is removed using a suitable rinsing liquid so that the remaining resin layer 6 and the transparent conductive layer 4 are in the same height. In this connection, the curing treatment reduces the volume of the resin approximately by a factor of 2, so that the thickness of the resin layer before curing is chosen about 1.6 micrometers for the photosensitive elements with 0.8 micrometer in thuickness. With ultraviolet light having 300 to 400 nm wavelength($10mW/cm^2$), the irradiation time is sufficiently 15 to 30 seconds.

After the etching, the substrate 1 is heated in a nitrogen atmosphere at 180° C. for 30 minutes, at 300° C. for 30 minutes and at 400° C. for 30 minutes. Then, the chromium layer 5 is removed by a known etching solution and the transparent chromium silicide layer 4 remains alone on the semiconductor 3 (see FIG. 6(G). The chromium silicide layer 4 prevents an indium tin oxide (ITO) layer, when formed on the semiconductor layer 3 in the subsequent step, from degradation caused by interaction between the semiconductor layer and the ITO layer.

Figures 6K, 6L:
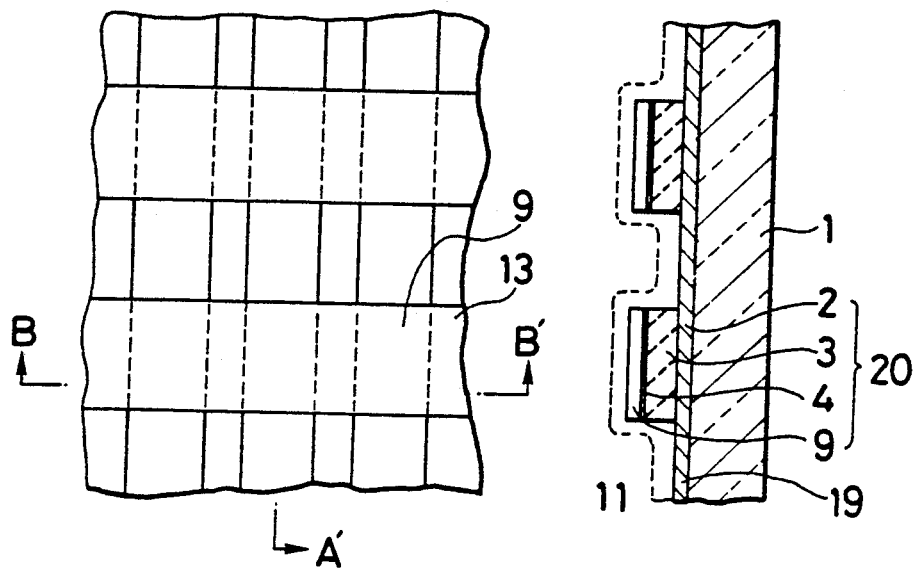
Figure 6M:
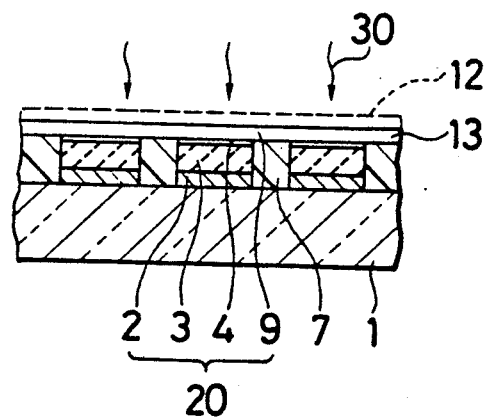

Then, as shown in FIGS. 6(H), 6(I) and 6(J), a tranparent electrodes 9 made of tin oxide is formed throughout the upper surface of the substrate with 0.1 to 0.5 micrometer in thickness, and selectively etched with a second photomask 2m to produce a plurality of electrode strips extending prependicular to the laminate members 10 . With the transparent electrode 9 as a mask, the semiconductor layer 3 are etched together with the chromium silicide layer 4, remaining the part of the same that is behind the electrode 9. Finally, the upper surface of the device is coated with a resin layer 12 as shown in FIGS. 6(L) and 6(M). Then, the manufacturing of an image sensor with a smooth top surface is completed.

The photoelectric semiconductor element 20 thus formed is comprised of the first electrode 2 in contact with the line 19, the semiconductor layer 3, the second electrode 4 and the third electrode 5 in contact with the line 13. And the semiconductor layer 3 is completely enclosed with the electrodes at the top and bottom surfaces and the resin layers at the side surfaces so that no current leakage and no parasitic channel takes place on the semiconductor layer.

Further, the opposed electrodes 2 and 4 can have opposed to each other through the semiconductor layer 3 which has the same area and the same shape as the electorodes 4 and 5 regardless of the precision of the patterning.

As described in the above, a device according to the present invention is comprised of laminate layers whose peripheries are surrounded respectively by a resin layer. The upper surface of the layer is exposed as if the resin layer is not provided. Although the surfaces on the layer and the resin layer are configured preferably flush with each other, the resin layer may be formed with its upper surface positioned lower than that of the member.

The present invention is useful especially for an image sensor because a number of sensor elements can be finely disposed on a substrate without causing cross talkings between adjacent ones and because the sensor elements maintain high reliablity for a long time and have a high abrasion resistance against external impacts.

It should be understood that the present invention is not limited to the specified embodiment but only to the appending claims, and a variety of modifications and changes of the embodiments may occur to those skilled in the art.

Although the embodiments have been described as to contact image sensors, the present invention can be applied also to photoelectric conversion devices of other types which have only one or a few conversion element. A photoelectric conversion semiconductor layer can incorporate p-i, n-i, m-i(Schotokky contact), n-i-p or m-i-n junctions, besides p-i-n or n-i-n junctions. The semiconductor substance to be used for the invention may be $Si_xGe_{1-x}$ ($0 < X \leq 1$), $Si_xC_{1-x}$ ($0 < X \leq 1$) or $Si_xSn_{1-x}$ ($0 < X \leq 1$).

What is claimed is:

1. A manufacturing method of a photoelectric conversion device comprising:
   a step of preparing a substrate;
   a step of forming a first electrode on said substrate;
   a step of forming a photoelectric semiconductor layer on said first electrode;
   a step of forming a second electrode on said semiconductor layer;
   a step of applying a reverse voltage across said semiconductor layer through said electrodes; and
   a step of severing said semiconductor and said electrodes into a plurality of photoelectric conversion elements.

2. The method of claim 1 wherein said plurality of elements constitute the photo-sensitive portion of a linear image sensor.

* * * * *

UNITED STATES PATENT AND TRADEMARK OFFICE
CERTIFICATE OF CORRECTION

PATENT NO.  : 5,039,620

DATED       : August 13, 1991

INVENTOR(S) : Shunpei YAMAZAKI, Akira MASE, Toshiji HAMATANI

It is certified that error appears in the above-identified patent and that said Letters Patent is hereby corrected as shown below:

On the title page, item [75] should read as follows:

-- [76] Inventors: Shunpei YAMAZAKI, 21-21, Kitakarasuyama 7-Chome, Setagaya-Ku, Tokyo 157 Japan; Akira MASE, Terrace Hase 3-3, 381-1, Hase, Atsugi-Shi, Kanagawa-Ken, 243 Japan; Toshiji HAMATANI, Flat Ochiai 201, 1144, Hase, Atsugi-Shi, Kanagawa-Ken, 243 Japan--

Signed and Sealed this

Eleventh Day of October, 1994

Attest:

BRUCE LEHMAN

*Attesting Officer*  *Commissioner of Patents and Trademarks*